US006704903B1

(12) United States Patent
Leung et al.

(10) Patent No.: US 6,704,903 B1
(45) Date of Patent: Mar. 9, 2004

(54) SIMPLIFIED BRANCH METRIC AND METHOD

(75) Inventors: Michael Ming Tak Leung, Sunnyvale, CA (US); Leo Ki Chun Fu, San Jose, CA (US); Borivoje Nikolic, Berkeley, CA (US); James Kar Shing Chiu, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/507,510

(22) Filed: Feb. 18, 2000

Related U.S. Application Data

(60) Provisional application No. 60/120,786, filed on Feb. 19, 1999.

(51) Int. Cl.[7] .............................................. H03M 13/00
(52) U.S. Cl. ...................................................... 714/796
(58) Field of Search ................................ 714/795, 796, 714/794; 375/262

(56) References Cited

U.S. PATENT DOCUMENTS 5,291,499 A * 3/1994 Behrens et al. ............. 714/795
5,604,724 A * 2/1997 Shiokawa .................... 369/124

OTHER PUBLICATIONS

Conway, A New Target Response with Parity Coding for High Density Magnetic Recording Channels, IEEE, p. 2382–2386, 1998.*
Siegel et al., Exact Bounds for Viterbi Detector PAth MEtric Differences, IEEE, p. 1093–1096, 1991.*
Fitzpatrick, A Reduced Complexity EPR4 Post–Processor, IEEE, p. 135–140, Jan. 1998.*
Champlin et al., Non–Linear MAP Estimation using a Continuous–state Viterbi Algorithm, IEEE, p. 3703–3708, 1992.*
Paaske et al., High speed Viterbi decoder architecture, Jun. 1998, First ESA Workshop on Tracking, Telemetry and Command Systems, p. 1 to 8.*

* cited by examiner

*Primary Examiner*—Phung M. Chung
*Assistant Examiner*—Shelly A Chase
(74) *Attorney, Agent, or Firm*—Carlton H. Hoel; W. James Brady; Frederick J. Telecky, Jr.

(57) ABSTRACT

A branch metric computation using limited bits by clipping the dynamic range and/or approximating the square of the difference between a sample value and the target value by a lookup table or piecewise linear with comparable slopes.

4 Claims, 5 Drawing Sheets

SIMPLIFIED BRANCH METRIC AND METHOD

This is a provisional application of Ser. No. 60/120,786 filed on Feb. 19, 1999.

BACKGROUND OF THE INVENTION

The invention relates to electronic devices, and, more particularly, to low-complexity partial response detectors.

Magnetic recording systems for digital data storage may have a functional structure as illustrated in FIG. 1. Briefly, for a write of data to storage, data bits typically first receive error correction encoding (such as Reed-Solomon); this coding aims to correct errors generated in the write-read process and which escape correction by the detection method of the read process. Further, interleaving blocks of error corrected encoded bits helps correct bursts of errors by spreading the errors over many blocks. Next, the error correction encoded bits are modulation (channel) coded (such as runlength-limited coding); the modulation coding helps read timing recovery. A further precoding may help intersymbol interference decoding. Then the modulation coded bits modulate the polarity of the write current in a read/write head over the magnetic media (e.g., a spinning disk) to set the magnetization directions of domains in the magnetic media. The pattern of magnetization directions is the stored data.

The read process begins with sensing the domain magnetization directions by voltages induced in the read/write head. After amplification the sensed voltages drive clocked analog-to-digital converters to yield a stream of digital samples. Noise in the read sensing, amplification, and conversion generates errors in the stream of digital samples. A detector (such as a peak detector or a Viterbi maximum likelihood detector) recovers the modulation encoded bits from the stream of digital samples. The modulation decoder then converts the coded bits to the error corrected bits, and lastly, the deinterleaver and error correction decoder corrects errors and recovers the data bits.

For partial response signaling various classes of frequency response for the signal channel prior to detection have been defined; and the class IV response appears particularly suitable for magnetic recording due to pulse shapes requiring minimal equalization. The partial response class IV channel is defined by a channel transfer function polynomial of the form $(1-D)(1+D)^N$ where N is a positive integer and D is a one period delay. FIGS. 2a–2c shows the pulse shapes for N=1, 2, and 3; the corresponding pulses are termed PR4, EPR4, and $E^2$PR4 (or EEPR4), respectively. Thus an (E)PR4 sensed voltage consists of a sequence of overlapping (E)PR4 pulses spaced one period apart and with positive, negative, or zero amplitudes depending upon the corresponding transitions of magnetization domain orientations. The sampling of the (E)PR4 sensed voltage yields the digital stream input to the detector, typically a sequence detector such as a maximum likelihood Viterbi decoder. Higher storage densities on a magnetic disk require more samples per induced pulse and consequent more overlap, and thus the higher order polynomial transfer functions are used. For example, storage densities of about 3 bits per pulse halfwidth would use $E^2$PR4 which has four nonzero samples per pulse; see FIG. 2c. The demand for high density originates with small, portable devices such as notebook computers.

However, higher order polynomial transfer functions require more complex Viterbi detectors because the number of states equals 2N+1 and thus the corresponding number of computations and the time to perform the computations increases rapidly. But high complexity implies high power consumption and slow execution, and this contradicts the requirements of notebook computers and their battery-based power supplies.

Known methods for reducing the complexity of a Viterbi detector include (i) reducing the number of accessible states by selection of modulation coding constraints and (ii) dynamically changing the add-compare-select (ACS) units of a typical Viterbi detector implementation from association with a single state to multiple states. See for example the background of U.S. Pat. No. 5,291,499.

Conway, A New Target Response with Parity Coding for High Density Magnetic Recording Channels, 34 IEEE Tr. Mag.2382 (1998), uses a single parity bit for post-Viterbi-detector processing to correct for occurrences of the dominant error patterns in a proposed system with an ideal response polynomial $(1-D2)(2+2D+D2)$.

Siegel et al, Exact Bounds for Viterbi Detector Path Metric Differences, IEEE ICASSP 1991, pp. 1093–1096, generate upper and lower bounds on the differences of path metrics for trellis states.

SUMMARY OF THE INVENTION

The present invention provides a simplified computation for sequence detectors by use of minimal precision branch metrics plus approximations to quadratics to limit computation.

This has the advantages of faster and lower complexity Viterbi detectors.

BRIEF DESCRIPTION OF THE DRAWINGS

The drawings are heuristic for clarity.

DESCRIPTION OF THE PREFERRED EMBODIMENTS

System Overview

Figure 1:
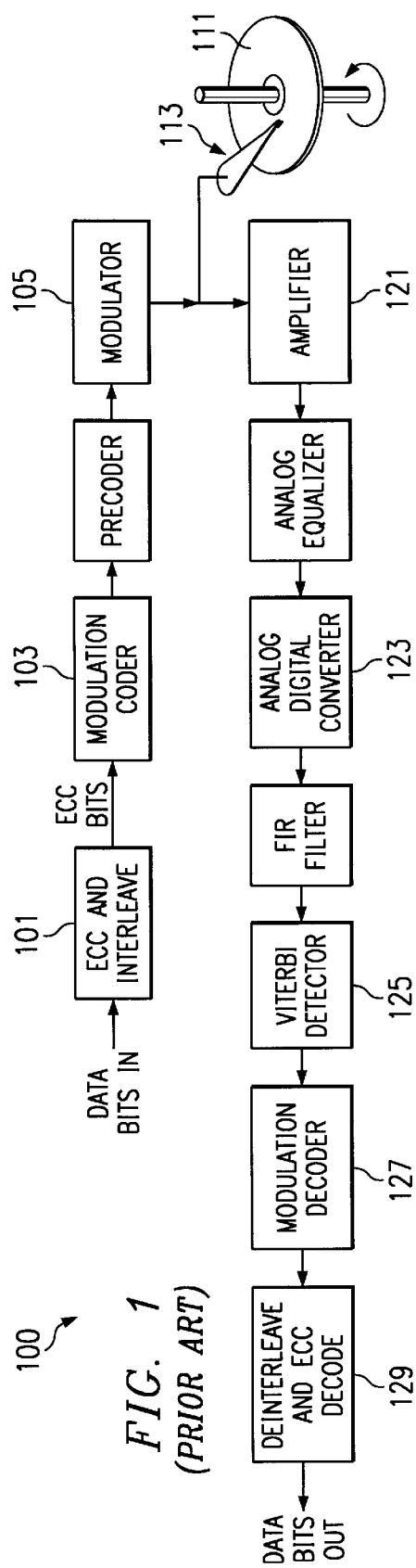
FIG. 1 schematically illustrates a magnetic data storage system.

FIG. 1 schematically illustrates a preferred embodiment magnetic storage and retrieval system incorporating a preferred embodiment low complexity Viterbi detector. In particular, writing data bits to storage on magnetic disk 111 proceeds as follows. Error correction coder 101 encodes data bits into error corrected bits by an error correction encoding method such as Reed-Solomon. Further, the error correction coding may include interleaving of blocks of bits. Next, modulation coder (channel coder) 103 codes blocks of bits output by error corrected coder 101 into blocks of bits using a runlength-limited code or other channel code which may include a parity bit for post processing removal of dominant errors. This modulation coding helps read timing recovery. These blocks may then be precoded. Then the (precoded) modulation coded bits drive the read/write head to set the magnetization orientation of domains on spinning magnetic disk 111; this stores the data bits.

Figure 2A:
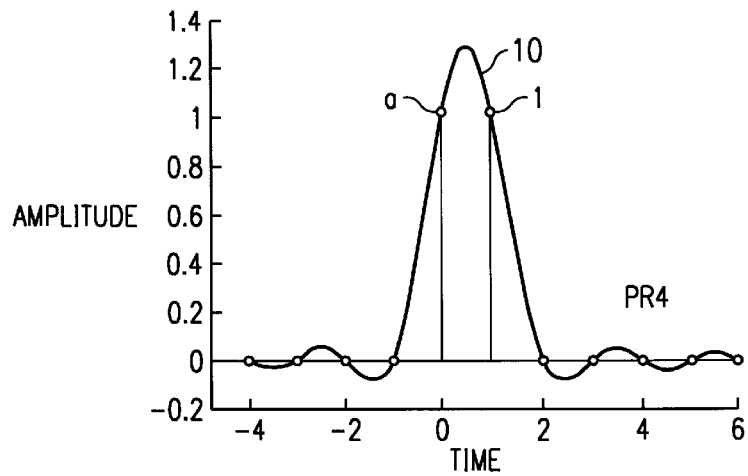
FIGS. 2a–2c show partial response class IV pulses.
Figure 2B:
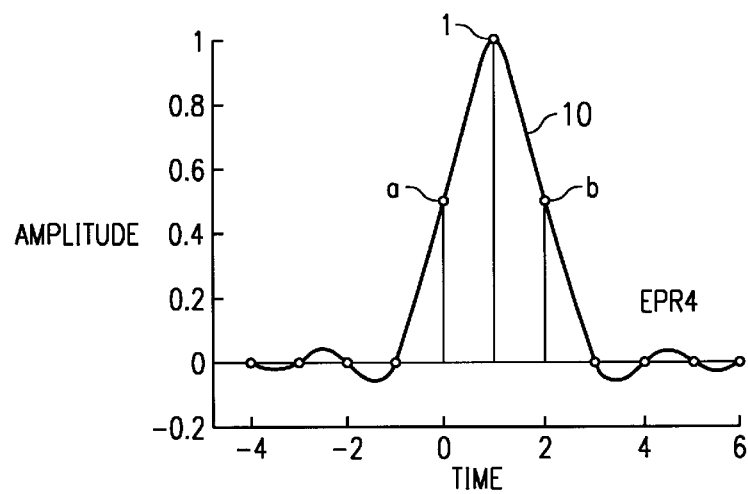
Figure 2C:
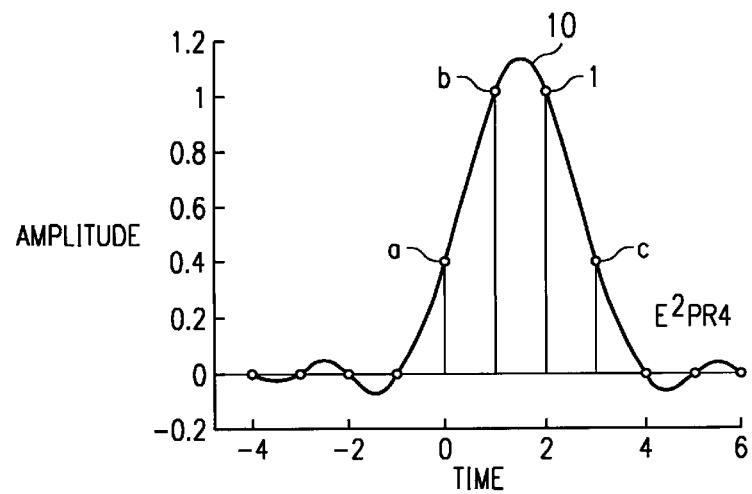

The reading of the stored data bits first amplifies (and filters) with amplifier 121 voltages induced in the read/write head 113 due to the transitions of magnetization orientation of domains on spinning disk 111; these voltages have the ideal form of a sequence of overlapping pulses, such as illustrated in FIGS. 2a–2c, with positive, negative, or zero amplitudes. The pulse overlaps imply intersymbol interference if the subsequent digital sampling includes contributions from more than one pulse. Clocked analog-to-digital converter 123 samples and quantizes the sequence of pulses to form a digital output stream; there may be 64 or 128 quantization levels (a 6-bit or 7-bit converter with one sign bit and 5 or 6 magnitude bits). Viterbi detector 125 performs a maximum likelihood decoding of the digital output stream.

The maximum likelihood detection corrects some errors in the digital output stream, but other errors remain uncorrected. For modulation codes which include a parity bit, a post processor can detect correlations with dominant error patterns and make corrections if the parity warrants it. Modulation decoder 127 is the inverse of modulation coder 103. Lastly, error correction decoder 129 deinterleaves and further corrects errors and recovers the data bits, hopefully with only minimal errors.

Figure 3:
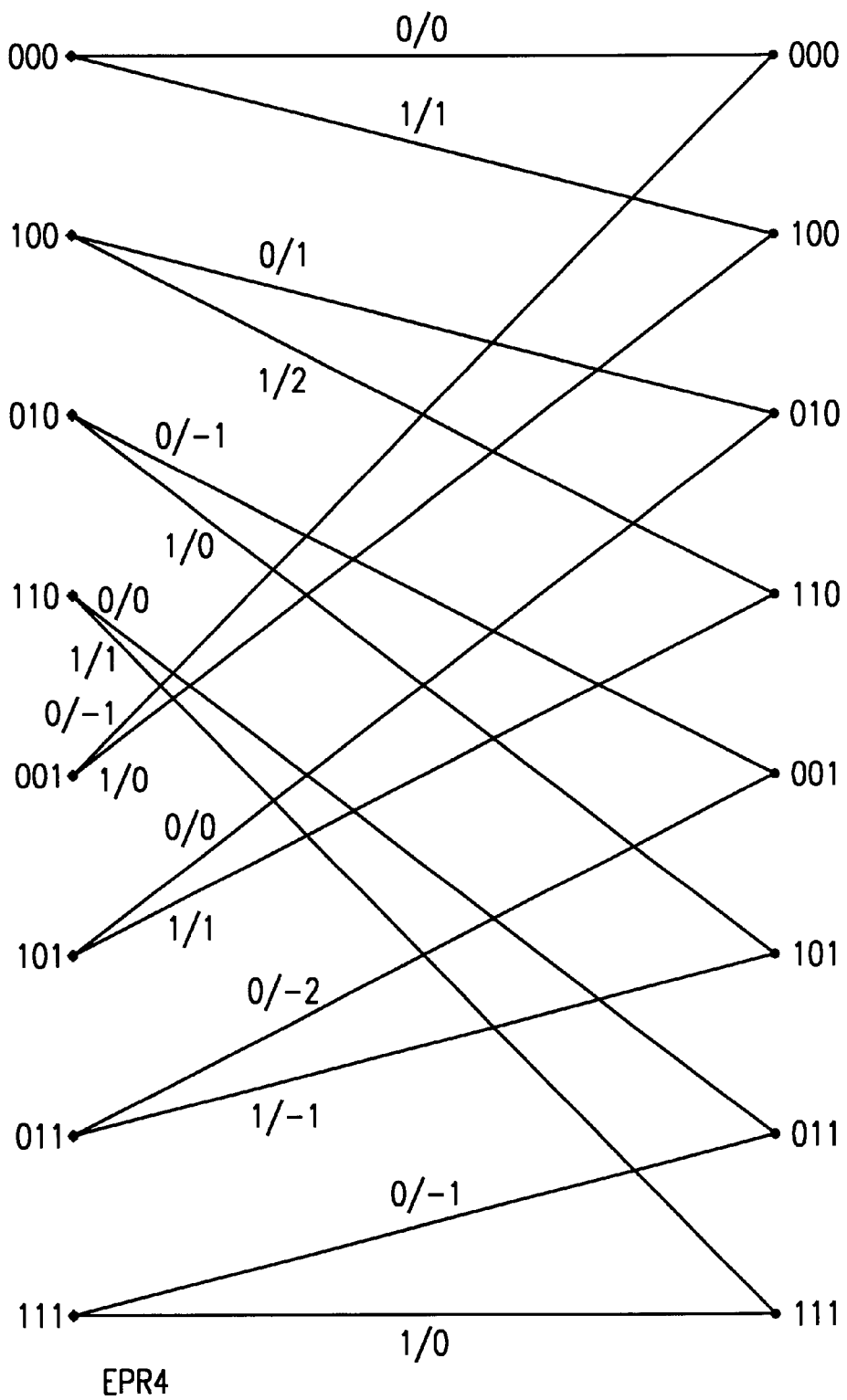
FIG. 3 illustrates a stage of a trellis.

Maximum likelihood detection of a digital stream with intersymbol interference can be described in terms of maximizing probabilities of paths through a trellis of state transitions (branches); each state corresponds to a possible pattern of recently received data bits and each stage of the trellis corresponds to a receipt of the next (noisy) input. For example, FIG. 3 illustrates one stage (one input) in the trellis for an EPR4 detector; the states are labeled with three previous data bits (reflecting the three sample overlap of pairs of pulses corresponding isolated data bits) and the branches are labeled with the bit for the transition plus the corresponding noiseless input (2, 1, 0, −1, or −2).

Figure 4:
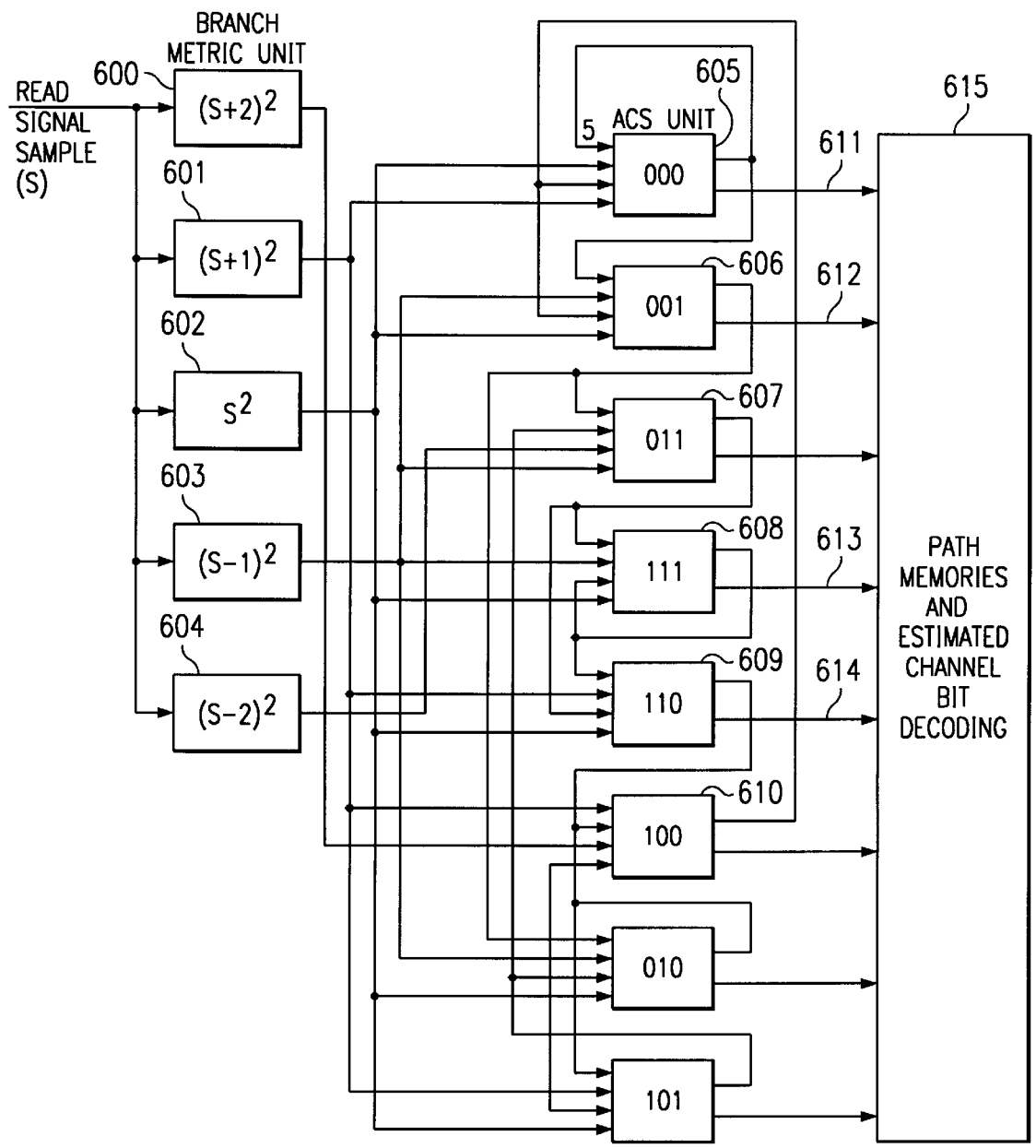
FIG. 4 shows a Viterbi detector.

FIG. 4 shows a prior art Viterbi detector which includes one add-compare-select (ACS) unit for each trellis state and a branch metric unit for each of the target levels $t_{ij}$; the survivor register for each state is in the path memories block. Each branch metric unit computes the square of the difference between its target value and the noisy input sample value. Each ACS stores a metric for its state and has inputs for the appropriate branch metric computations and the related state metrics from other ACS units. At receipt of an input signal to the detector, each ACS adds its (two) input branch metric computations to the corresponding state metrics of the states emitting the branches; and then it compares these (two) sums and selects the smaller as the updated state metric for its state. Each state's survivor register updates its contents to maintain a survival path for the state; that is, the sequence of selected bits (transitions) that have led to the updated state metric. The detected bits will correspond to the path with the smallest metric. At any time the maximum likelihood path through the trellis up to that time is the path traced backwards through the trellis starting from the state with the smallest state metric at that time and recursively using the branch previously selected as the branch into the traced-to state; that is, the survivor register contents for the state with the smallest state metric.

The length of the survival registers depends on the modulation code used. As the decision goes deeper into the survival registers, more of the contesting survival paths (versus the correct path) will be eliminated, the detected data will become more accurate.

Low Complexity Viterbi Detectors

A first preferred embodiment Viterbi detector 125 includes branch metric units which each compute the absolute difference between the input (digitized) sample value and a (equalization) target value plus clips the difference to a maximum equal to the absolute difference of the target input values for the two branches entering the state. Note that the equalizer may set the target values by adaptive least squares equalization. This use of absolute values, rather than squares, plus clipping simplifies and speeds up the computations. The following describes this in more detail using the EPR4 channel as an example for explanation.

FIG. 3 shows one stage of the trellis for an EPR4 Viterbi detector. EPR4 has 8 ($=2^3$) states and two branches into and out of each state. Each sampling time period corresponds to traversing one stage of the trellis. The preferred embodiment branch metric units compute a branch ij metric as $|x-t_{ij}|$ where x is the value of the digital input sample received from the filter and $t_{ij}$ is the target value for the branch ij transition. FIG. 3 shows the target value for a received input for a transition as the second number on the branch; that is, the target $t_{ij}$ equals one of the values −2, −1, 0, 1, and 2. Note that this is for the normalized amplitude of A=½ which makes the energy ($I_2$ norm) of the pulse equal to 1. Thus the five branch metric units perform the five computations $|x+2|$, $|x+1|$, $|x|$, $|x-1|$, and $|x-2|$ with input x. Of course, in the noiseless case the sample x equals one of the target values, so one branch metric is zero and the others are all greater than or equal to 1. Now if the analog-to-digital converter clips x to lie in the interval −4 to +4 (that is, saturates at −4 and +4) and if 7 bits are used to used for the digitized x, then only 7 bits are needed for the five branch metric computations since the sign bit can be dropped for the absolute values. This contrasts with the 14 bits needed to compute the squares of $(x-t_{ij})$.

In EPR4 channels the dominant data bit error events are ±(1) and ±(1,−1,1) which have noiseless target sequences of ±(1,1,−1,−1) and ±(1,0,−1,1,0,−1), respectively. These target sequences both have the same sum of branch metrics difference from (0,0,0,0) and (0,0,0,0,0,0), respectively, for the absolute value branch metric and the square branch metric. Consequently,.the preferred embodiment branch metric should not degrade performance.

Further, clip the branch metric value at 1 (that is, saturation in the subtractions $x-t_{ij}$ at −1, +1). This reduces the number of bits needed for the branch metric from 7 down to 4 because the range from 0 to 6 is reduced to the range from 0 to 1 (actually the range is from 0 to 15/16 which corresponds to 0.0000 to 0.1111). This clipping should not affect performance because a branch metric larger than 1 will make the corresponding updated state metric large and a path through this state will likely not be the correct path and soon be eliminated. Of course, the absolute value and clipping at 1 could be used with other precisions, such as 5 bits or 8 bits for x, with corresponding decreases in the bits needed.

Figure 5:
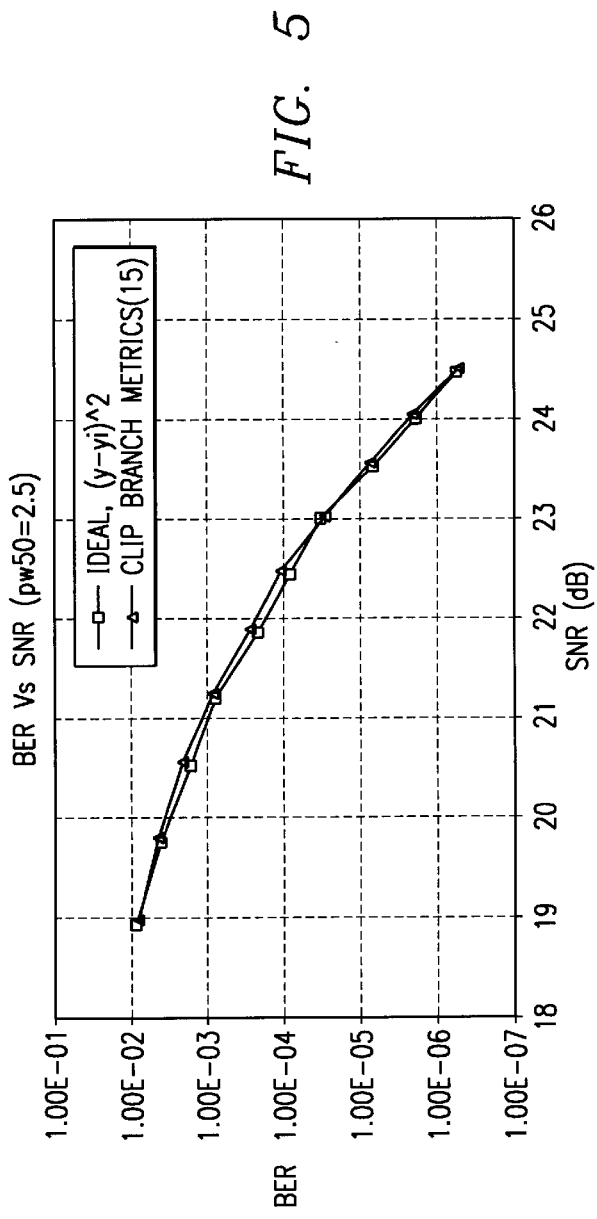
FIG. 5 is a simulation comparison for a first preferred embodiment.

FIG. 5 illustrates a comparison of the bit error rate (BER) as a function of signal-to-noise ratio (SNR) for the standard branch metric using $(x-t_{ij})^2$ and the preferred embodiment branch metric $min(1,|x-t_{ij}|)$. No degradation in performance appears, especially for SNR in the range of 23–25 dB.

For $E^2PR4$ channels, the trellis has sixteen states, two branches entering and exiting each state, and the input sample target values $t_{ij}$ are −3,−2,−1,0,1,2, and 3. Thus the input sample x could again be constrained to have its value lie in the range from −4 to +4 and again be expressed with 7 bits resolution. For each state, the two branches entering the state have a difference in target sample values equal to 1. Thus the same preferred embodiment branch metric of $\min(1,|x-t_{ij}|)$ could be used. However, for $E^2PR4$ the data bit error events $\pm(1)$ and $\pm(1,-1,1)$ now have noiseless target sequences of $\pm(1,2,0,-2,-1)$ and $\pm(1,1,-1,0,1,-1,-1)$, respectively. The second error target sequence again has the sum of square branch metrics equal to the sum of absolute-clipped-at-1 branch metrics (both equal 6), but the first error target sequence has the sum of square branch metrics equal to 10 which exceeds the sum of absolute-clipped-at-1 branch metrics equal to 4 (or 6 for the clipping level raised to 2 or above). Thus the absolute value branch metric fails to sufficiently emphasize this error event. Indeed, if the pertinent state metrics prior to this error event differ by something between 4 and 10, then at the end of the error event, the wrong state metric could be the smaller only for the absolute branch metric and the wrong path selected only for the absolute value branch metric. Hence, $E^2PR4$ channels should use the second preferred embodiment branch metric which uses a nonlinear approximation as described in the following section.

Nonlinear Approximation Branch Metrics

Turbo EPR4 channels include a parity bit in the modulation coding; and the parity bit permits post-Viterbi correction of the most common data bit error events $\pm(1)$ and $\pm(1,-1,1)$. Thus less common data bit error events become dominant, such as $\pm(1,-1)$. This error event has a target input sequence of $\pm(1,0,2,0,-1)$. Thus the squared branch metrics sum is 6, whereas the absolute-clipped-at-1 metrics sum is only 3 (and the unclipped absolute branch metrics sum is 4). This is analogous to the $E^2PR4$ situation. The second preferred embodiment branch metric avoids degradation in performance in these situations by a limited approximation to a square plus an increase in the clipping level to 2.

In particular, again presume the input digitized sample x has a 7 bit representation for the range $-4$ to $+4$ (actually from $-4$ to $+3^{15}/_{16}$ inclusively). Then clip the branch metric $|x-t_{ij}|$ to a maximum of 2 (actually 1 15/16), so the branch metric requires 5 bits. The preferred embodiment maps these 5 bits to the range from 0 to 2 to approximate $(x-t_{ij})^2/2$ to retain the 5 bit result. The following table in which the numbers are expressed in binary and the 5-bit approximation rounds off in the usual manner by adding 0.00001 and truncating.

| $|x-t_{ij}|$ | $(x-t_{ij})^2$ | $(x-t_{ij})^2/2$ | 5-bit approximation |
|---|---|---|---|
| 0.0000 | 0.0000000 | 0.000000000 | 0.0000 |
| 0.0001 | 0.00000001 | 0.000000001 | 0.0000 |
| 0.0010 | 0.00000100 | 0.000000100 | 0.0000 |
| 0.0011 | 0.00001001 | 0.000001001 | 0.0000 |
| 0.0100 | 0.00010000 | 0.000010000 | 0.0001 |
| 0.0101 | 0.00011001 | 0.000011001 | 0.0001 |
| 0.0110 | 0.00100100 | 0.000100100 | 0.0001 |
| 0.0111 | 0.00110001 | 0.000110001 | 0.0010 |
| ... | | | |
| 0.1111 | 0.11100001 | 0.011100001 | 0.0111 |
| 1.0000 | 1.00000000 | 0.100000000 | 0.1000 |
| 1.0001 | 1.00100001 | 0.100100001 | 0.1001 |
| ... | | | |
| 1.0110 | 1.11100100 | 0.111100100 | 0.1111 |
| 1.0111 | 10.00010001 | 1.000010001 | 1.0001 |
| 1.1000 | 10.01000000 | 1.001000000 | 1.0010 |
| ... | | | |
| 1.1111 | 11.11000001 | 1.111000001 | 1.1110 |

Of course, the foregoing table has a maximum approximation of $^{1}/_{16}$ less than the maximum possible (e.g., 1.1110 shown rather than the 1.1111 maximum); this gap could be eliminated by dividing $(x-t_{ij})^2$ by 31/16 rather than by 2. In this case the table becomes

| $|x-t_{ij}|$ | 5-bit approximation |
|---|---|
| 0.0000 | 0.0000 |
| 0.0001 | 0.0000 |
| 0.0010 | 0.0000 |
| 0.0011 | 0.0000 |
| 0.0100 | 0.0001 |
| ... | |
| 0.1111 | 0.0111 |
| 1.0000 | 0.1000 |
| 1.0001 | 0.1001 |
| ... | |
| 1.0101 | 0.1110 |
| 1.0110 | 1.0000 |
| 1.0111 | 1.0001 |
| 1.1000 | 1.0011 |
| ... | |
| 1.1111 | 1.1111 |

Figure 6:
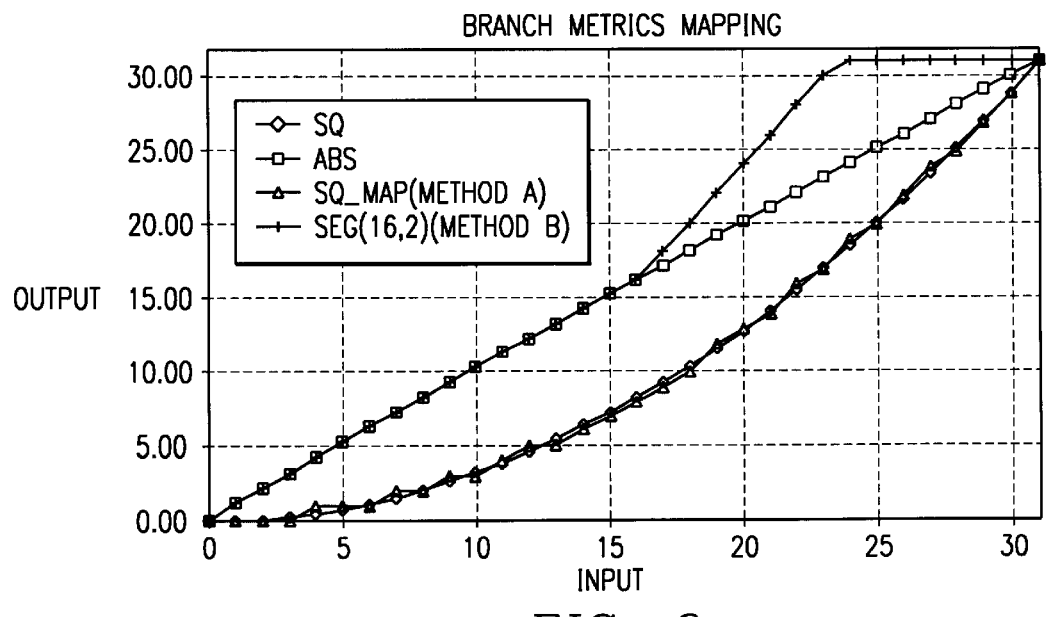
FIG. 6 illustrates preferred embodiment branch metrics.

FIG. 6 illustrates the foregoing approximation and the square divided by 31/16 in the lower two curves. Thus the use of this preferred embodiment branch metric will apply the correct emphasis to larger values of $|x-t_{ij}|$ up to a saturation at 2. The actual mapping of the value of $|x-t_{ij}|$ to the 5-bit approximation may be just a lookup table in the branch metric units.

FIG. 6 also illustrates another preferred embodiment nonlinear mapping of $|x-t_{ij}|$ by the branch metric units to emphasize larger values of $|x-t_{ij}|$. In particular, the piecewise linear branch metric unit output is:

| | |
|---|---|
| $|x-t_{ij}|$ | if $0 \leq |x-t_{ij}| < 1$ |
| $2|x-t_{ij}| - 1$ | if $1 \leq |x-t_{ij}| < 3/2$ |
| 2 | if $3/2 \leq |x-t_{ij}|$ | where the saturation value of 2 for large $|x-t_{ij}|$ can be taken as 1 15/16 to fit into five bits (i.e., 1.1111). The upper two curves in FIG. 6 are $|x-t_{ij}|$ and the foregoing piecewise linear preferred embodiment. Note that most errors of size greater than 1 are only slightly larger than 1, so the slope of the piecewise linear branch metric curve mimicking the slope of the square in the range 1 to 1.5 provides sufficient emphasis to the larger $|x-t_{ij}|$.

Figure 7:
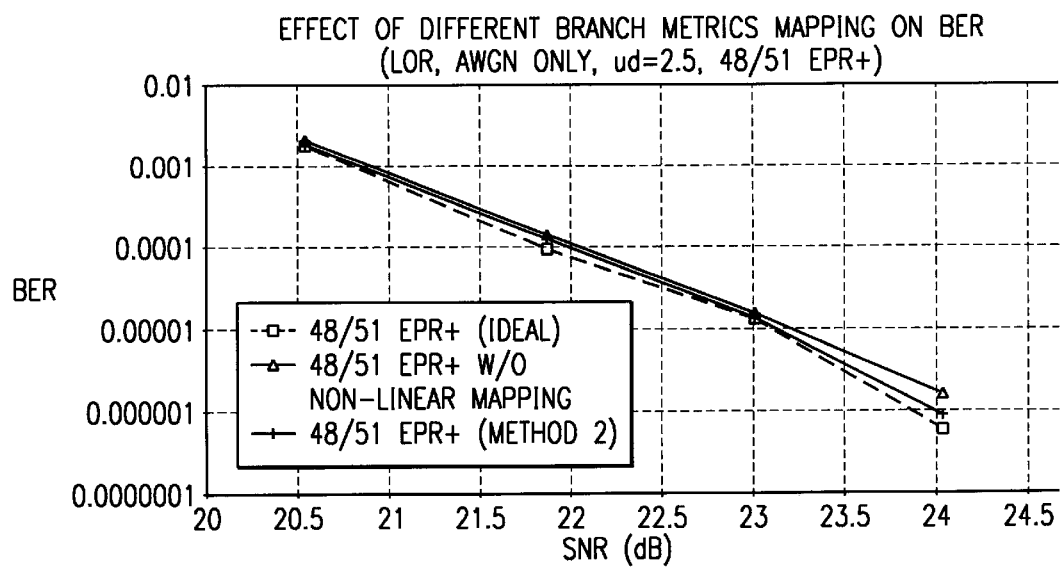
FIG. 7 is a simulation comparison for another preferred embodiment.

FIG. 7 shows simulations for an EPR4 Turbo channel with the foregoing piecewise linear branch metric as compared to the $(x-t_{ij})^2$ branch metric (ideal for white noise) and the absolute value branch metric without the piecewise linear emphasis. The piecewise linear branch metric is close to the ideal and much better than the absolute value branch metric.

Modifications

The preferred embodiments can be modified in various ways while retaining the feature of a limited range approximation of the squared difference branch metric.

For example, the preferred embodiments could apply their clipping and approximations to squares over different ranges of values. The piecewise linear approximations could use more than two linear segments in the approximation, difference slope(s) of the linear segment(s) which would be comparable to the corresponding slopes of the square, and different point(s) for saturation. The sample and target values could be in two's complement or sign-magnitude representation, and so forth. Also, the same approach works for the maximum branch metric selection methods as may be used to minimize power consumption.

What is claimed is:

1. A method of Viterbi detection, comprising:
   (a) determining the difference between a received sample and a target value;
   (b) approximating the square of said difference using a piecewise linear approximation of the square; and
   (c) using the results of step (b) as a branch metric determination in a Viterbi detector.

2. The method of claim 1, wherein:
   (a) when said target value is normalized to be in the set consisting of −2, −1, 0, +1, +2, and said sample is similarly normalized and represented with resolution of 1/16, said piecewise linear approximation of step (b) of claim 3 is:
      (i) when said difference is less than 1, said approximation equals the absolute value of said difference; and
      (ii) when said difference is at least 1, said approximation equals 15/16.

3. The method of claim 1, wherein:
   (a) said piecewise linear approximation is:
      (i) when said difference is less than 1, said approximation equals said difference;
      (ii) when said difference is at least 1 but less than 3/2, said approximation equals twice said difference minus 1; and
      (iii) when said difference is at least 3/2, said approximation equals a constant about 2.

4. A method of Viterbi detection, comprising:
   (a) determining the difference between a received sample and a target value where said difference has a resolution of 5 bits and is clipped at a maximum value of 1 15/16;
   (b) approximating with a resolution of 5 bits the square of said difference divided by 31/16; and
   (c) using the results of step (b) as a branch metric determination in a Viterbi detector.

* * * * *